United States Patent
Cernea

(10) Patent No.: US 7,551,483 B2
(45) Date of Patent: Jun. 23, 2009

(54) NON-VOLATILE MEMORY WITH PREDICTIVE PROGRAMMING

(75) Inventor: Raul-Adrian Cernea, Santa Clara, CA (US)

(73) Assignee: Sandisk Corporation, Milpitas, CA (US)

( * ) Notice: Subject to any disclaimer, the term of this patent is extended or adjusted under 35 U.S.C. 154(b) by 136 days.

(21) Appl. No.: 11/733,706

(22) Filed: Apr. 10, 2007

(65) Prior Publication Data

US 2008/0253193 A1    Oct. 16, 2008

(51) Int. Cl.
G11C 16/04    (2006.01)
(52) U.S. Cl. ............................. 365/185.19; 365/185.24; 365/185.17; 365/185.18
(58) Field of Classification Search ............ 365/185.19, 365/185.24, 185.17, 185.18, 185.28, 185.03
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari et al. | |
| 5,172,338 A | 12/1992 | Mehrotra et al. | |
| 5,289,401 A | 2/1994 | Shima | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 6,366,496 B1 | 4/2002 | Torelli et al. | |
| 6,903,972 B2 | 6/2005 | Lasser | |
| 7,042,766 B1 | 5/2006 | Wang et al. | |
| 7,151,692 B2 * | 12/2006 | Wu ........................ | 365/185.03 |
| 7,158,413 B2 * | 1/2007 | Kasai et al. ............ | 365/185.18 |
| 7,366,014 B2 * | 4/2008 | Micheloni et al. ...... | 365/185.03 |

(Continued)

FOREIGN PATENT DOCUMENTS

EP    0 913 832 A    5/1999

OTHER PUBLICATIONS

Eitan et al., "NROM: A Novel Localized Trapping 2-Bit Nonvolatile Memory Cell," IEEE Electron Device Letters, vol. 21, No. 11, Nov. 2000, pp. 543-545.

(Continued)

*Primary Examiner*—David Lam
(74) *Attorney, Agent, or Firm*—Davis Wright Tremaine LLP

(57) ABSTRACT

In a nonvolatile memory having an array of memory cells, wherein the memory cells are individually programmable to one of a range of threshold voltage levels, there is provided a predictive programming mode in which a predetermined function predicts what programming voltage level needs to be applied in order to program a given memory cell to a given target threshold voltage level. In this way, no verify operation needs to be performed, thereby greatly improving the performance of the programming operation. In a preferred embodiment, the predetermined function is linear and is calibrated for each memory cell under programming by one or more checkpoints. A checkpoint is a set of coordinates on the predetermined function determined by a conventional programming mode employing alternating program and verify operations.

19 Claims, 16 Drawing Sheets

U.S. PATENT DOCUMENTS

2003/0002374 A1    1/2003   Tedrow
2008/0062765 A1    3/2008   Tu et al.
2008/0253197 A1   10/2008   Cernea

OTHER PUBLICATIONS

Tu et al., Method for Non-Volatile memory with Linear Estimation of Initial Programming Voltage, U.S. Appl. No. 11/531,227, filed Sep. 12, 2006, 54 pages.

EPO/ISA, "Notification of Transmittal of the International Search Report and the Written Opinion of the International Searching Authority, or the Declaration," corresponding International Patent Application No. PCT/US2008/059740, mailed on Sep. 30, 2008, 13 pages.

USPTO, "Office Action," mailed in related U.S. Appl. No. 11/733,694, filed Oct. 28, 2008, 18 pages.

USPTO, "Office Action," mailed in related U.S. Appl. No. 11/733,694 on Apr. 8, 2009, 16 pages.

* cited by examiner

Convention Programming with alternate Progam/Verify sequence

Samples of of slow, medium and fast cells
observed during actual Programming

Predetermined Function for Predictive Programming

Predictive programming using a predetermined function

Program/Verify for State (0); Predictive programming for higher states

Example of a Distribution of a population of cells under Predictive programming

Calibration of Predictive programming Function with a Checkpoint

First Example of Predictive Programming Interleaved with Checkpoints

First Example of Predetermined Functions Interleaved with Checkpoints
for Predictive Programming

Second Example of Predictive Programming Interleaved with Checkpoints

NON-VOLATILE MEMORY WITH PREDICTIVE PROGRAMMING

CROSS REFERENCE TO RELATED APPLICATION

This application is also related to the following U.S. patent application: U.S. application Ser. No. 11/733,694, entitled "Predictive Programming for Non-Volatile Memory" by Raul Adrian Cernea, filed on Apr. 10, 2007, U.S. Patent Application Publication No. 2008/0253197 A1.

FIELD OF THE INVENTION

This invention relates generally to non-volatile semiconductor memory such as electrically erasable programmable read-only memory (EEPROM) and flash EEPROM, and specifically to memory and programming operations in which the number of program-verify operations is minimized.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S.

Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

The conventional programming technique of using a series of alternating program/verify cycles is to deal with the uncertainty in the programming process in which the cell's threshold voltage grows fast initially in response to a relatively large change in $V_{PGM}$. However, the growth slows down and eventually stops as charges programmed into the floating gate act as a shield to diminish the effective electric field for further tunneling of the electrons into the floating gate. The process appears highly non-linear and hence a trial-and-error approach is employed.

The disadvantage of the program/verify programming technique is that the verify cycle takes up time and impacts performance. The problem is exacerbated by the implementation of memory cells capable of storing multiple bits. Essentially verify needs to be performed for each of the possible multiple states of a memory cell. For a memory with 16 possible memory states, this means each verify step would incur at least 16 sensing operations. In some other schemes it could even be a few times more. Thus, with increasing number of distinguishable state levels in multi-level memory cells ("MLC"), the verify cycle of the program/verify scheme becomes increasingly time-consuming.

U.S. patent application Ser. No. 11/531,227, entitled, "Method for Non-volatile Memory with Linear Estimation of Initial Programming Voltage" filed by Loc Tu et al on Sep. 12, 2006 discloses a method of estimating initial programming voltages by linear estimation. In order to achieve good programming performance for a non-volatile memory, the initial programming voltage $V_{PGM0}$ and the step size must be optimally chosen at the factory. This is accomplished by testing each page of memory cells. The word line coupled to a selected page is successively programmed by a series of voltage pulses of a staircase waveform with verifications in between the pulses until the page is verified to a designated pattern. The programming voltage at the time the page is programmed verified will be used to estimate by linearly scaling back to the initial value of a starting programming voltage for the page. The estimation is further refined by using the estimate from a first pass in a second pass. Thus, conventional alternating programming and verifications are used to establish a final programming voltage for successfully programming a page. Then the final programming voltage is linearly scaled back to arrived at an estimated initial programming voltage for the page. This type of scaling is on a gross scale at a page level and does not address the disadvantage of conventional programming and verifying the memory in the field on a cell by cell basis.

Therefore there is a general need for high capacity and high performance non-volatile memory. In particular, there is a need to have a high capacity nonvolatile memory with improved programming performance where the aforementioned disadvantage is minimized.

SUMMARY OF INVENTION

According to one general aspect of the invention, in a nonvolatile memory having an array of memory cells, wherein the memory cells are individually programmable to one of a range of threshold voltage levels, there is provided a predetermined function that predicts what programming voltage level needs to be applied in order to program a given memory cell to a given target threshold voltage level. In this way, no verify operation needs be performed, thereby greatly improving in the performance of the programming operation.

In one embodiment, the predetermined function is approximated by a linear function, which proportionally yields a programming voltage level for a given targeted threshold voltage level. The linear function has a slope given by a predetermined average value applicable to the population of cells of the memory array. The linear function is uniquely determined for the given memory cell by predetermining a checkpoint on the linear function for the given memory cell. The checkpoint is based on an actual programming voltage that programs the memory cell to a designated threshold voltage level. The checkpoint preferably corresponds to one of lowest program states of the memory cell. The memory cell is initially programmed to the checkpoint and verified by, for example, the conventional program/verify programming technique. In this way, the checkpoint values of the actual programming voltage necessary to program the memory cell to the designated memory state is determined. The predetermined function is thus calibrated to yield the checkpoint programming voltage value when evaluated at the checkpoint threshold voltage level before being used to determine a programming voltage value for programming the memory cell to the target threshold voltage level.

In another embodiment, multiple checkpoints may be designated among the range of possible threshold voltage levels supported by the memory cells. Each checkpoint will be used to calibrate a local predetermined function in the vicinity of each checkpoint. The local predetermined function is used to predict a programming voltage level for programming to a targeted threshold voltage level in the vicinity of an associated checkpoint.

The predictive programming technique is advantageous in that programming to a target state does not require verify operations. A verify operation is only needed for determining a checkpoint which in general is much less in number than the number of possible memory states.

There will be variations that will cause the predictive programming to yield erroneous results, but these will be statistically predictable errors which can be handled by an appropriate error correction code ("ECC").

Additional features and advantages of the present invention will be understood from the following description of its preferred embodiments, which description should be taken in conjunction with the accompanying drawings.

DETAILED DESCRIPTION OF THE PREFERRED EMBODIMENTS

Memory System

FIG. 1 to FIG. 5 illustrate example memory systems in which the various aspects of the present invention may be implemented.

Figure 6:
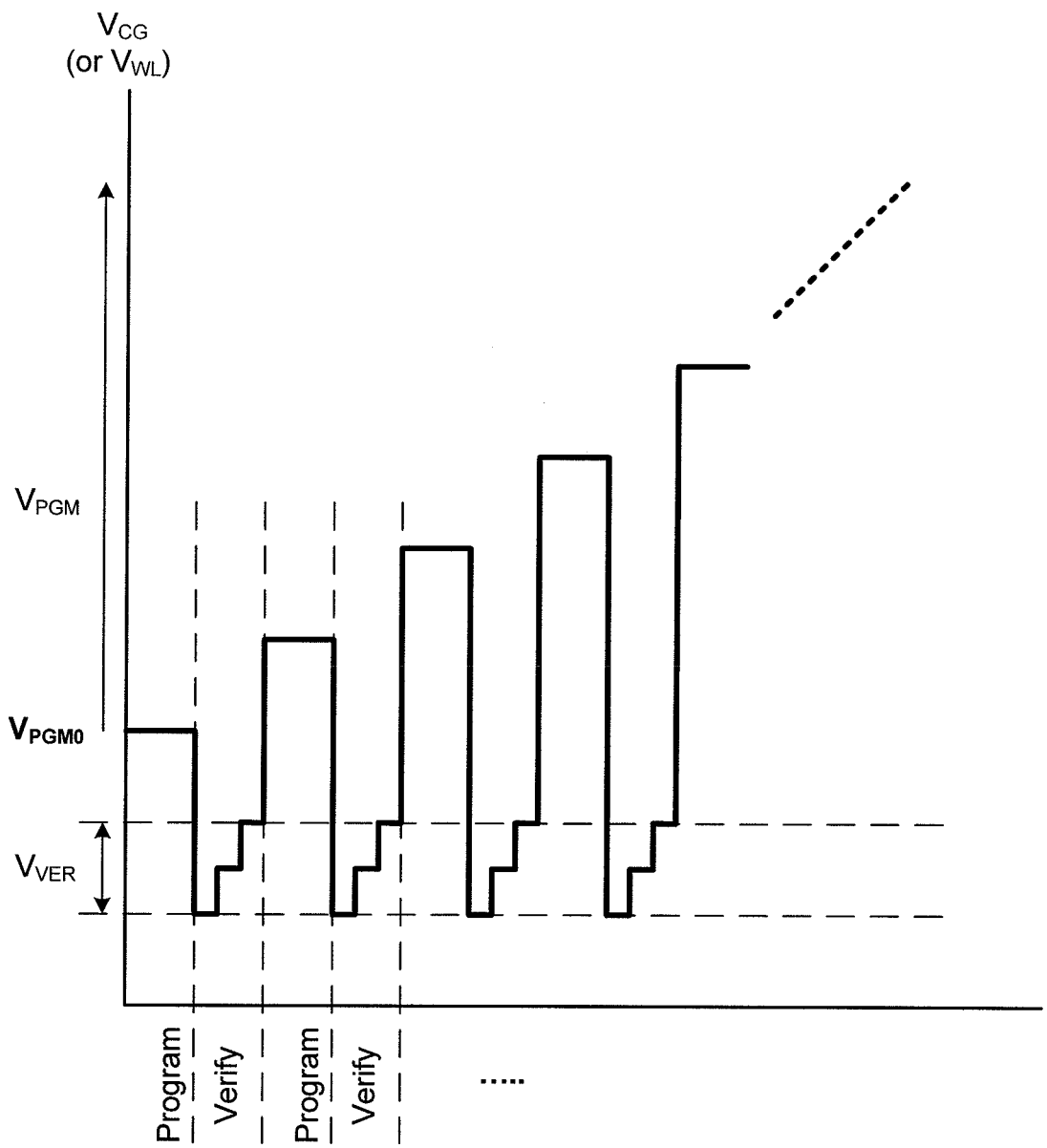
FIG. 6 illustrates a conventional technique for programming a memory cell to a target memory state.

FIG. 6 illustrates a conventional programming technique.

FIG. 7 to FIG. 16 illustrate the various aspects and embodiments of the present invention.

Figure 1:
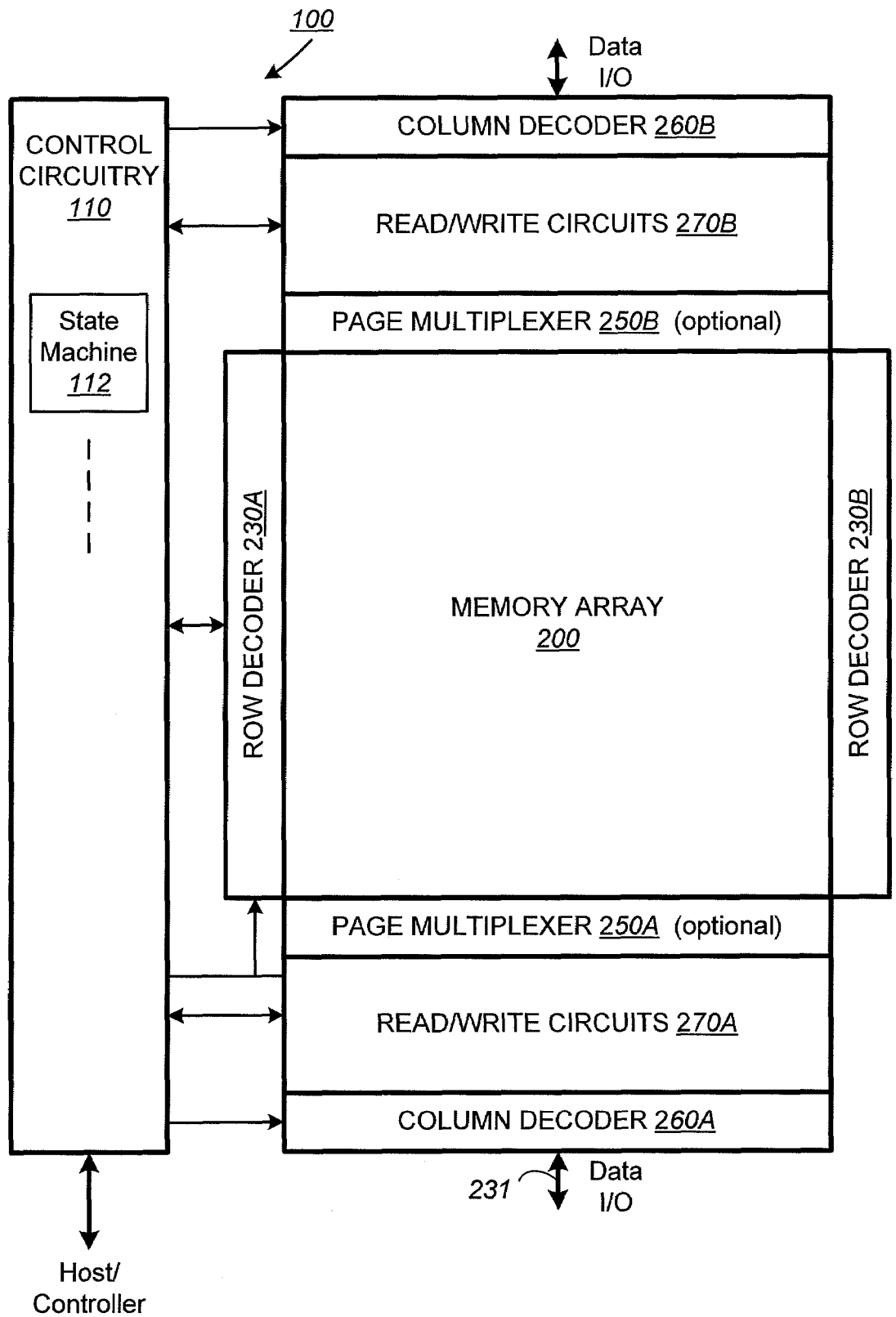
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
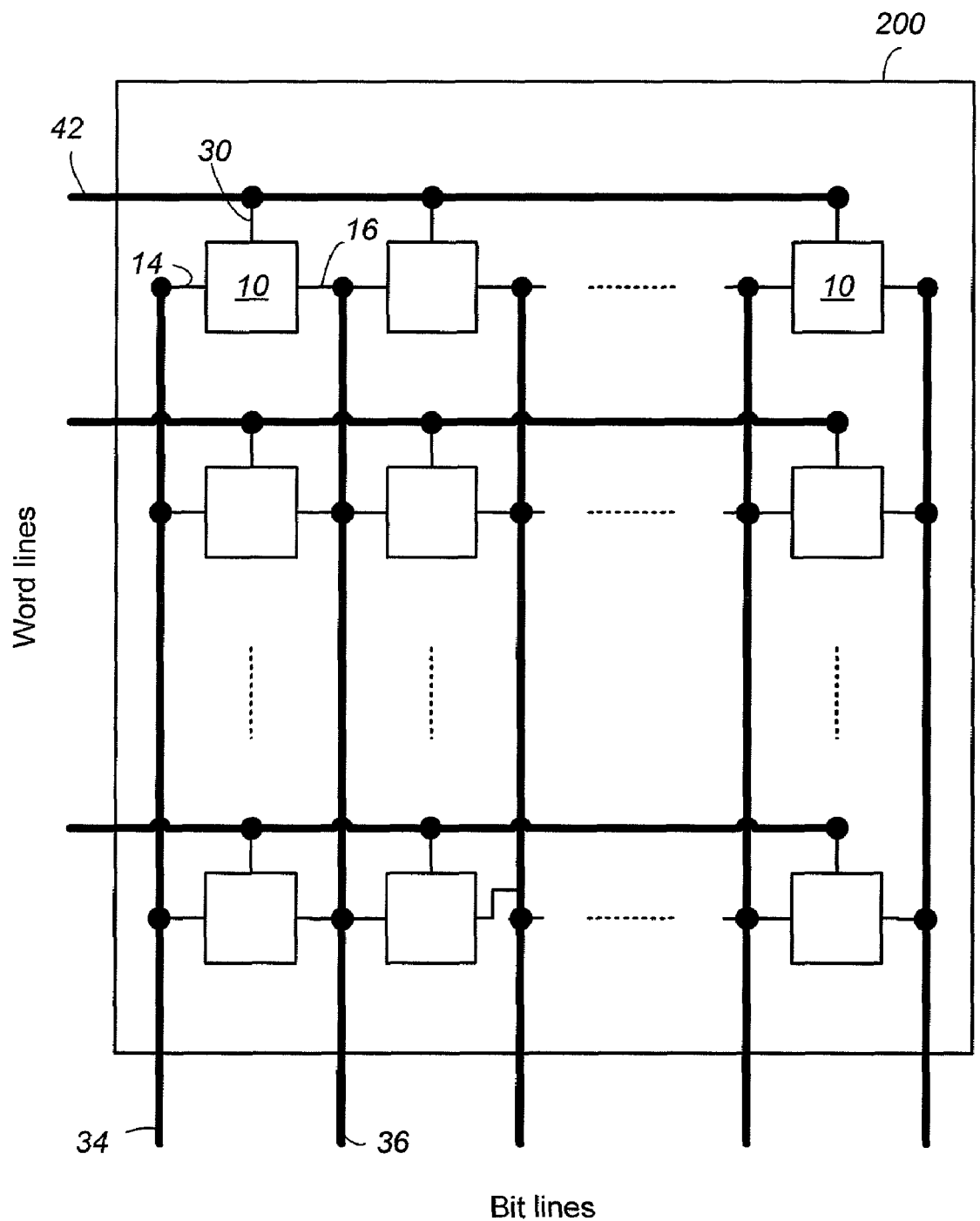
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
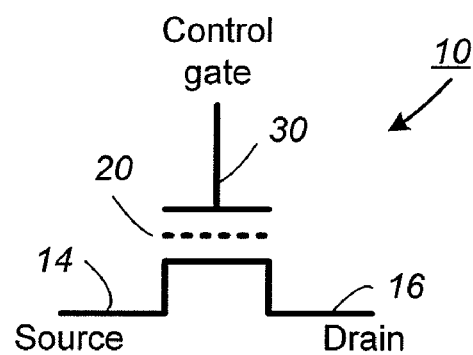
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
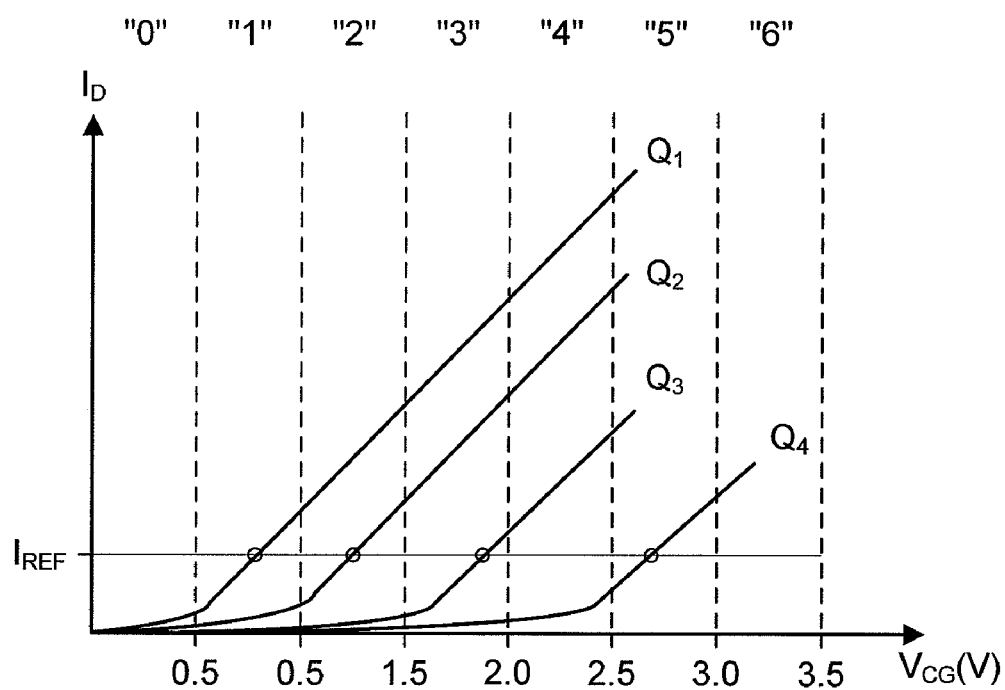
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
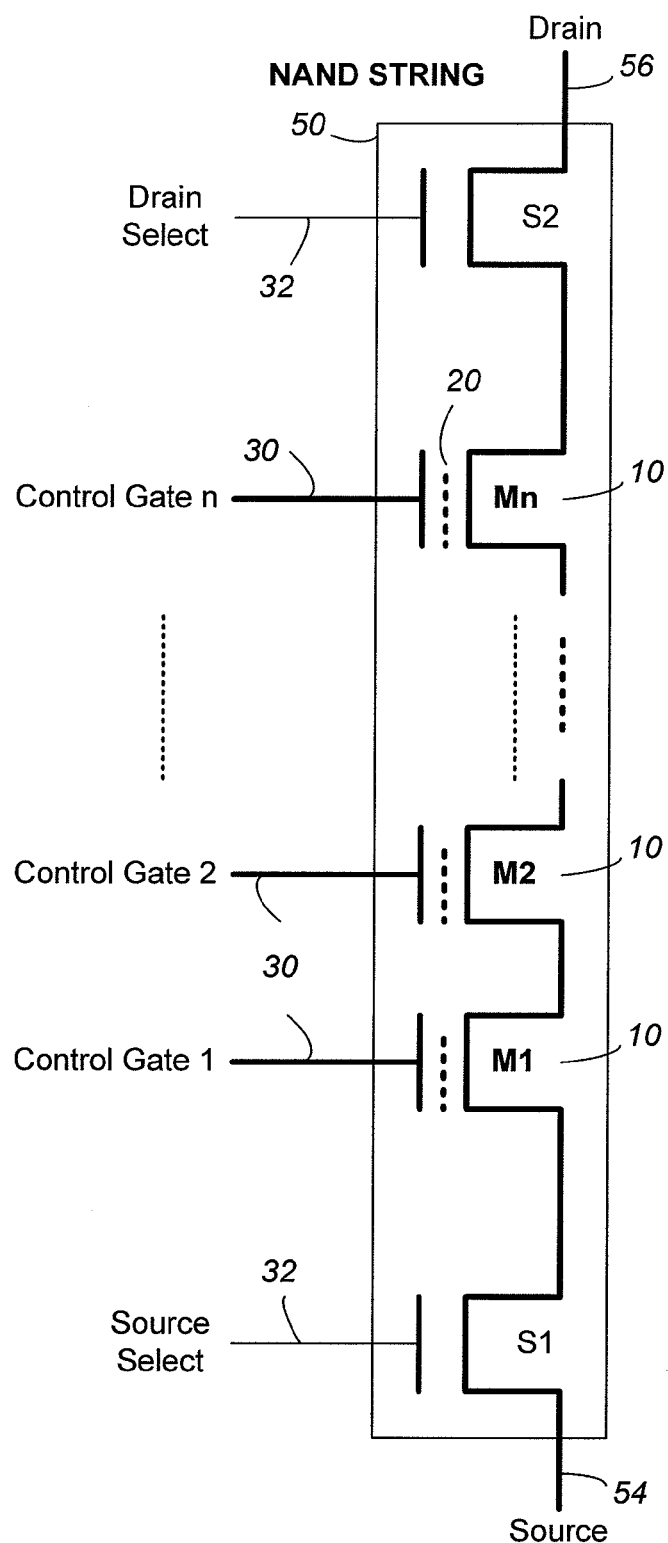
FIG. 5A illustrates schematically a string of memory cells organized into an NAND string.

FIG. 5A illustrates schematically a string of memory cells organized into an NAND string. An NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
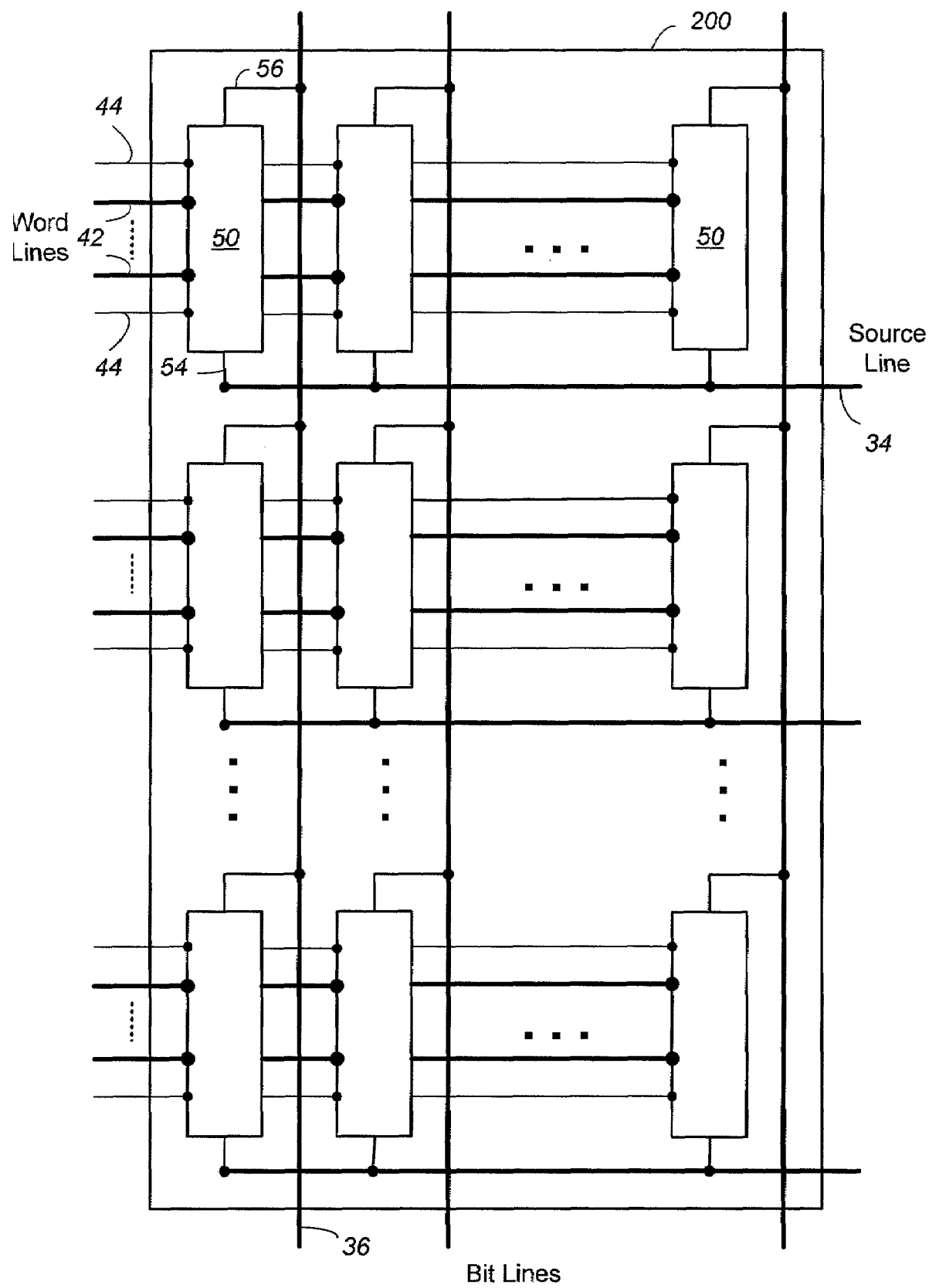
FIG. 5B illustrates an example of an NAND array 200 of memory cells, constituted from NAND strings 50 such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

FIG. 6 illustrates a conventional technique for programming a memory cell to a target memory state. A programming voltage $V_{PGM}$ is applied to the control gate of the memory cell via a coupled word line. The $V_{PGM}$ is a series of programming voltage pulses in the form of a staircase waveform starting from an initial voltage level, $V_{PGM0}$. The cell under programming is subject to this series of programming voltage pulses, with an attempt each time to add incremental charges to the floating gate. In between programming pulses, the cell is read back or verified to determine its source-drain current relative to a breakpoint level. The read back process may involve one or more sensing operation. Programming stops for the cell when it has been verified to reach the target state. The programming pulse train used may have increasing period or amplitude in order to counteract the accumulating electrons programmed into the charge storage unit of the memory cell. Programming circuits generally apply a series of programming pulses to a selected word line. In this way, a page of memory cells whose control gates are coupled to the word line can be programmed together. Whenever a memory cell of the page has been programmed to its target state, it is program-inhibited while the other cells continue to be subject to programming until all cells of the page have been program-verified.

The conventional programming technique of using a series of alternating program/verify cycles is to deal with the uncertainty in the programming process in which the cell's threshold voltage grows fast initially in response to a relatively large change in $V_{PGM}$. However, the growth slows down and eventually stops as charges programmed into the floating gate act as a shield to diminish the effective electric field for further tunneling of the electrons into the floating gate. The process appears highly non-linear and hence a trial-and-error approach is employed.

The disadvantage of the program/verify programming technique is that the verify cycle takes up time and impacts performance. The problem is exacerbated by the implementation of memory cells capable of storing multiple bits. Essentially verify needs to be performed for each of the possible multiple states of a memory cell. For a memory with 16 possible memory states, this means each verify step would incur at least 16 sensing operations. In some other schemes it could even be a few times more. Thus, with increasing state levels in multi-level memory cells ("MLC"), the verify cycle of the program/verify scheme becomes increasingly time-consuming.

Thus, there is a need for a memory device with improved programming performance where the aforementioned disadvantage is minimized.

Predictive Programming Techniques

According to one general aspect of the invention, in a nonvolatile memory having an array of memory cells, wherein the memory cells are individually programmable to one of a range of threshold voltage levels, there is provided a predetermined function that predicts what programming voltage level needs to be applied in order to program a given memory cell to a given target threshold voltage level. In this way, no verify operation needs be performed, thereby greatly improving in the performance of the programming operation.

In one embodiment, the predetermined function is approximated by a linear function, which proportionally yields a programming voltage level for a given targeted threshold voltage level. The linear function has a slope given by a predetermined average value applicable to the population of cells of the memory array. The linear function is uniquely determined for the given memory cell by predetermining a checkpoint on the linear function for the given memory cell. The checkpoint is based on an actual programming voltage that programs the memory cell to a designated threshold voltage level. The checkpoint preferably corresponds to one of lowest program states of the memory cell. The memory cell is initially programmed to the checkpoint and verified by, for example, the conventional program/verify programming technique. In this way, the checkpoint values of the actual programming voltage necessary to program the memory cell to the designated memory state is determined. The predetermined function is thus calibrated to yield the checkpoint programming voltage value when evaluated at the checkpoint threshold voltage level before being used to determine a programming voltage value for programming the memory cell to the target threshold voltage level.

In another embodiment, multiple checkpoints may be designated among the range of possible threshold voltage levels supported by the memory cells. Each checkpoint will be used to calibrate a local predetermined function in the vicinity of each checkpoint. The local predetermined function is used to predict a programming voltage level for programming to a targeted threshold voltage level in the vicinity of an associated checkpoint.

The predictive programming technique is advantageous in that programming to a target state does not require verify operations. A verify operation is only needed for determining a checkpoint which in general is much less in number than the number of possible memory states.

There will be variations that will cause the predictive programming to yield erroneous results, but these will be statistically predictable errors which can be handled by an appropriate error correction code ("ECC").

Figure 7:
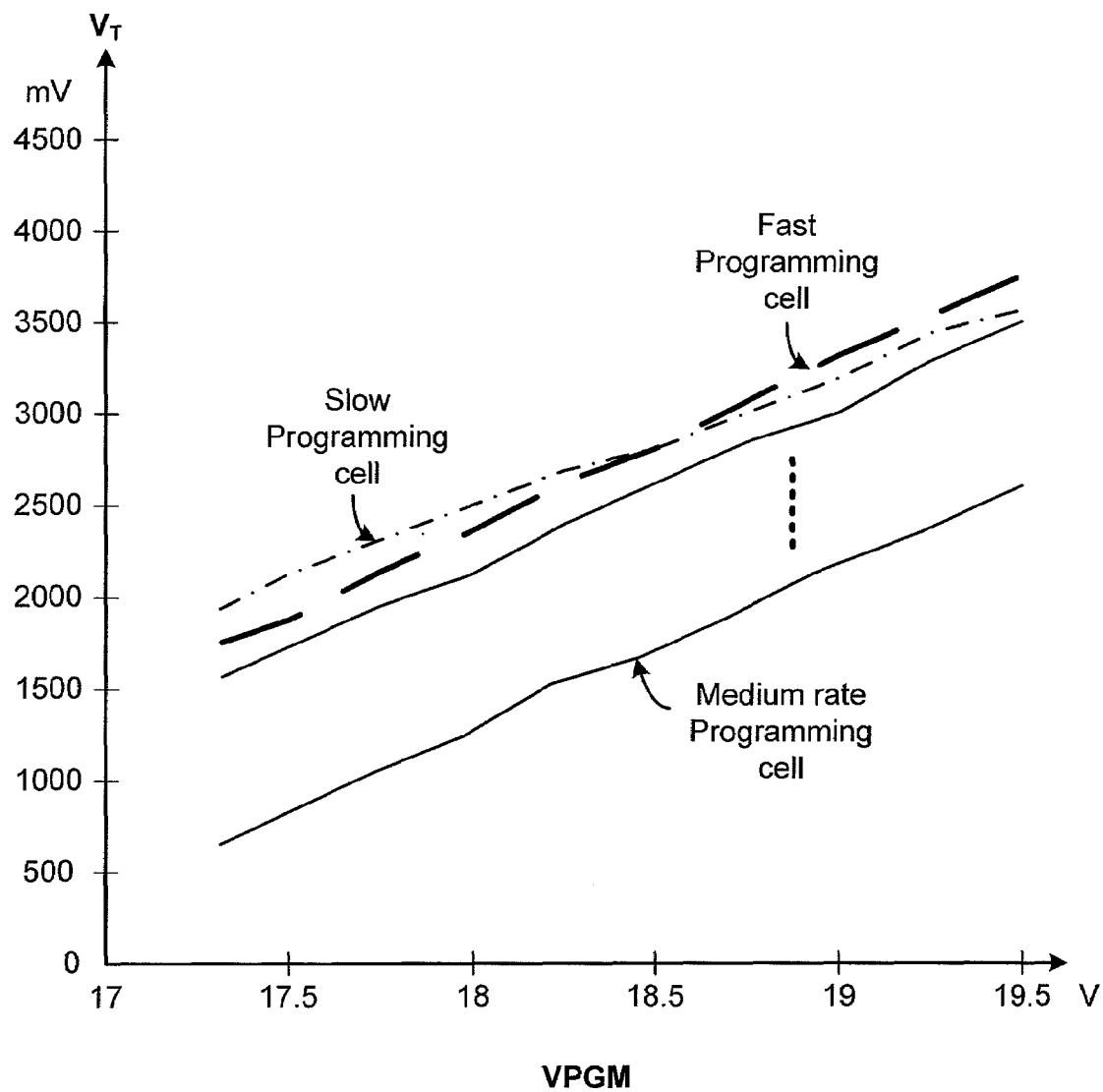
FIG. 7 illustrates samples of programming various memory cells in a given memory device and the observed relation between applied programming voltage and threshold voltage level.

FIG. 7 illustrates samples of programming various memory cells in a given memory device and the observed relation between applied programming voltage and threshold voltage level. It can be seen that the programming behavior of individual memory cell is surprisingly linear even across substantial range of the threshold window. Individual cells within an array more or less behave the same way where the change in programmed threshold voltage is substantially proportional to the change in programming voltage level. Due to how deeply erased the individual cells were and other factors, the individual cells may differ by the number of programming pulses to arrive at a designated checkpoint, but the predetermined function for each of the individual cells has a substantially similar slope. FIG. 7 shows an example each of a slow programming cell, a fast programming cell, as well as some examples of medium rate programming cells (solid lines). It can be seen the variation in slopes between the different examples are slight.

Figure 8:
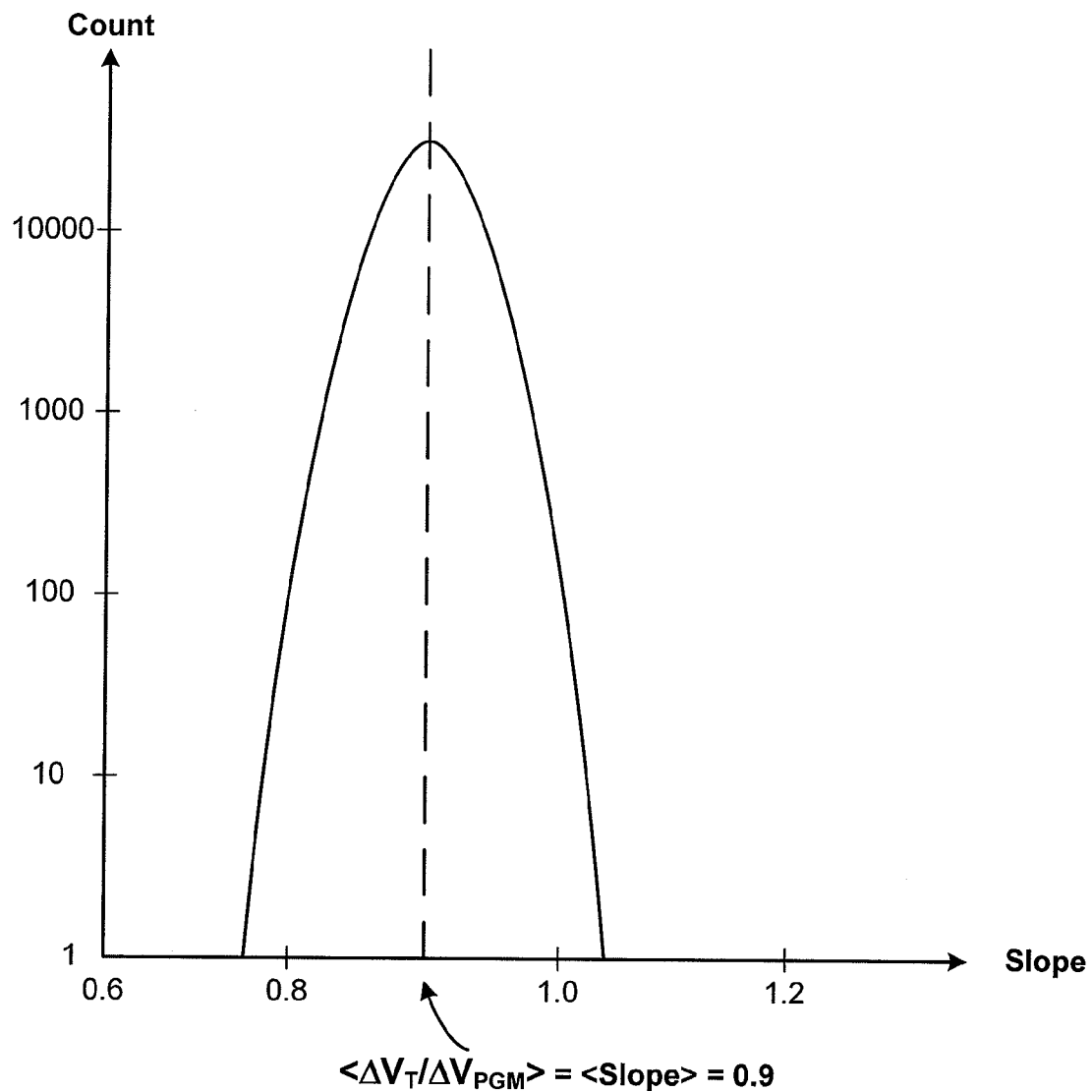
FIG. 8 illustrates schematically the distribution of the slopes shown in FIG. 7 for a sample of memory cells in a given memory device.

FIG. 8 illustrates schematically the distribution of the slopes shown in FIG. 7 for a sample of memory cells in a given memory device. The distribution essentially exhibits a normal distribution with a mean slope around 0.9 and a standard deviation approximately of 0.1. The actual programming employed two different programming voltage step sizes. It has been observed that both step sizes yield similar distributions and mean slopes.

Figure 9:
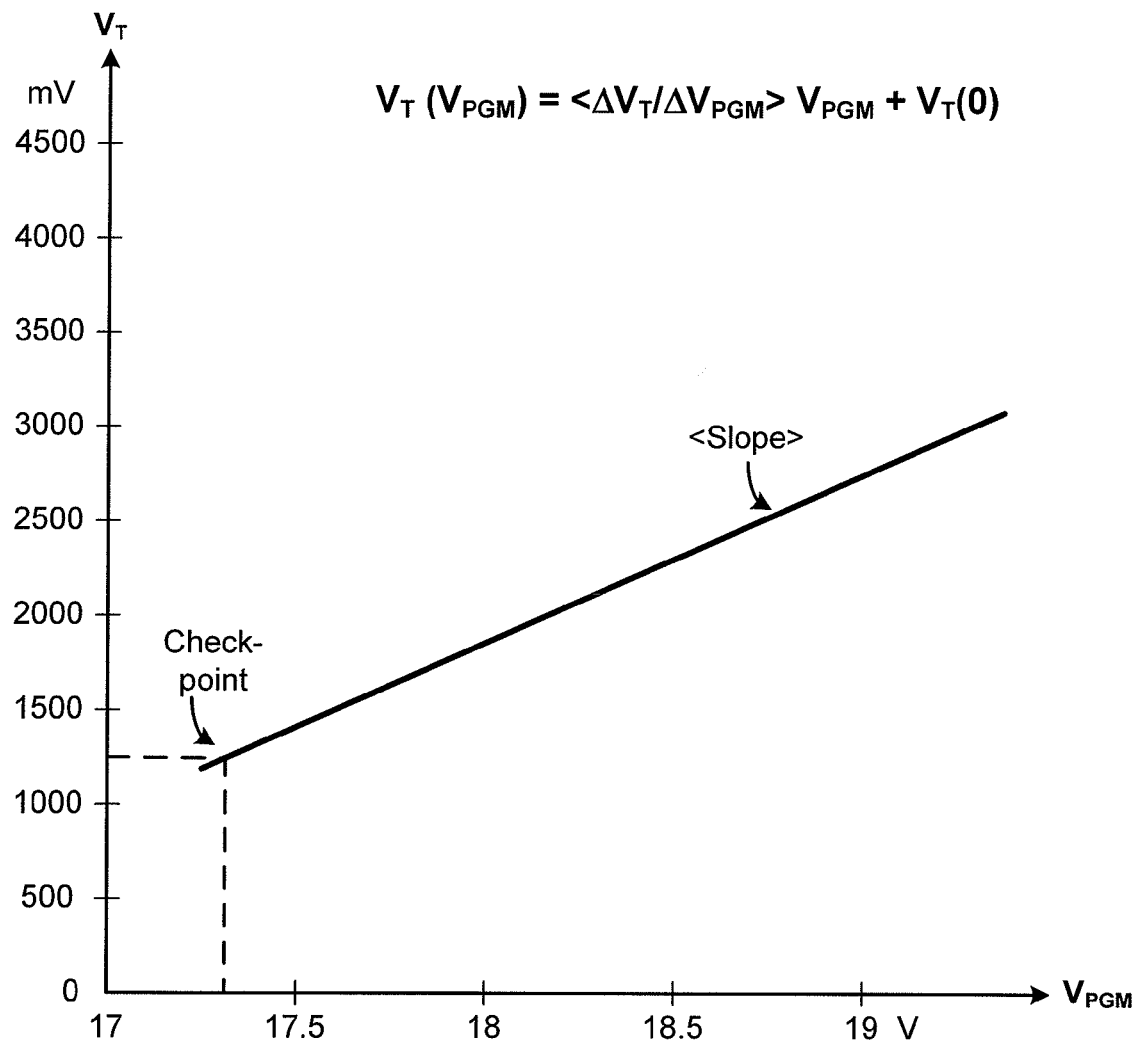
FIG. 9 illustrates a preferred embodiment of the predetermined function used to provide the programming voltage needed to program the memory cell to a targeted threshold voltage level.

FIG. 9 illustrates a preferred embodiment of the predetermined function used to provide the programming voltage needed to program the memory cell to a targeted threshold voltage level. The predetermined function is approximated by a linear function where the targeted threshold level $V_T$ is given as a function of the programming voltage $V_{PGM}$ by the relation:

$$V_T(V_{PGM}) = <\text{Slope}> V_{PGM} + V_T(0) \qquad \text{Equation (1)}$$

(where $<\text{Slope}> = \Delta V_T / \Delta V_{PGM}$)

Conversely, $$V_{PGM}(V_T) = 1/<\text{Slope}>[V_T - V_T(0)]; \qquad \text{Equation (2)}$$

In the preferred embodiment, the mean $<\text{Slope}>$ can be predetermined by testing at the factory samples from similar production batches. For example, the testing may yield $<\text{Slope}>$ to be 0.9. The $V_T(0)$ is cell-dependent and is predetermined by a checkpoint from each memory cell prior to a predictive programming of each cell. Once the $<\text{slope}>$ and $V_T(0)$ are known, the predetermined function for the memory cell is defined and Equation (2) can be used to obtain the programming voltage level needed to program to a targeted threshold voltage level.

Figure 10:
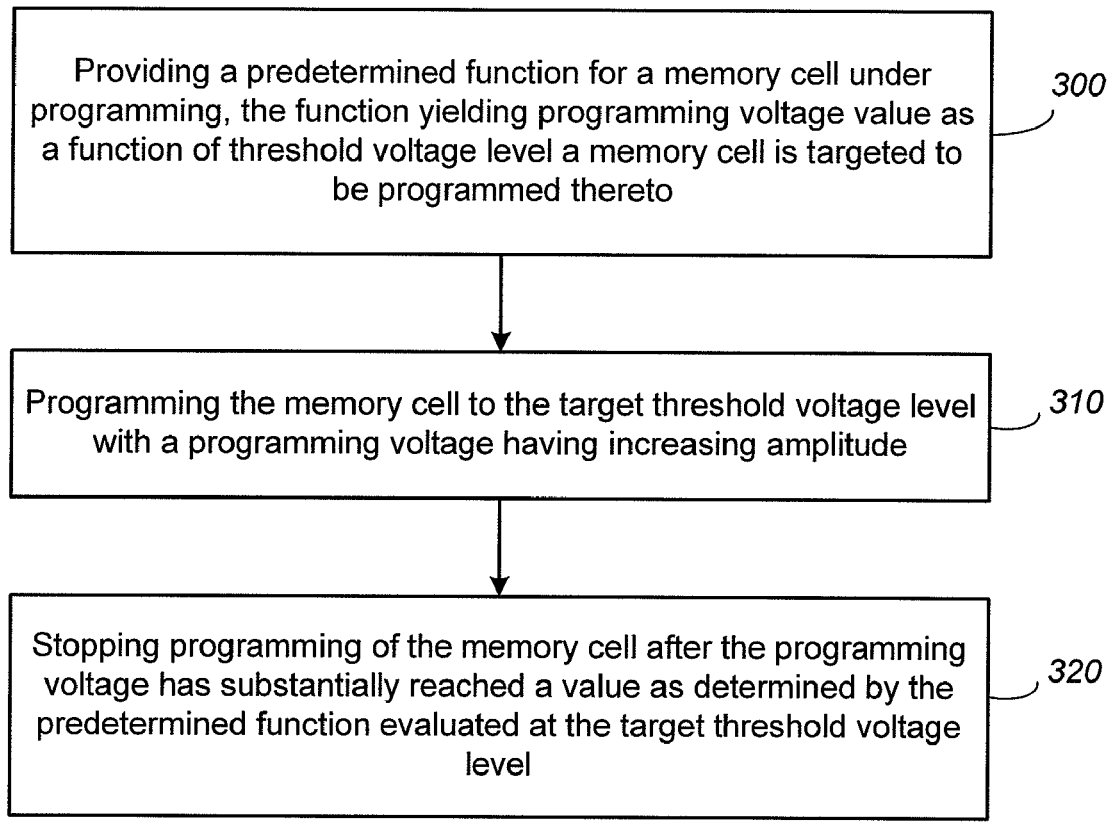
FIG. 10 is a flow diagram illustrating predictive programming according to a general embodiment of the invention.

FIG. 10 is a flow diagram illustrating predictive programming according to a general embodiment of the invention.

STEP 300: Providing a predetermined function for a memory cell under programming, the function yielding programming voltage value as a function of threshold voltage level a memory cell is targeted to be programmed thereto.

STEP 310: Programming the memory cell to the target threshold voltage level with a programming voltage having increasing amplitude. The programming voltage is applied to the control gate of the memory cell via a coupled word line.

STEP 320: Stopping programming of the memory cell after the programming voltage has substantially reached a value as determined by the predetermined function evaluated at the target threshold voltage level. Typically, a page of memory cells coupled to the same word line is being programmed at the same time. When the memory cell in question has received the value as determined by the predetermined function evaluated at the target threshold voltage level, it is inhibited from further programming despite possible additional programming pulses on the word line for other memory cells of the page.

In general the predetermined function need not be approximated by a linear function. If the predetermined function is to accurately cover a wide range of threshold voltage levels, it can be determined by testing the production batch at the factory and modeled by some suitable function.

Generally, the memory cell being programmed is one of a page of similar memory cells simultaneously under programming. There will be a predetermined function provided for each memory cell of the page. Since all memory cells of the page share the same word line, once a memory cell of the page has been programmed by the predictive programming voltage, it is inhibited from further programming.

The predictive programming mode illustrated in FIG. 10 is preferably implemented in the state machine 112 (see FIG. 1) in the control circuitry 110 that controls memory operations of the memory array 200.

Figure 11:
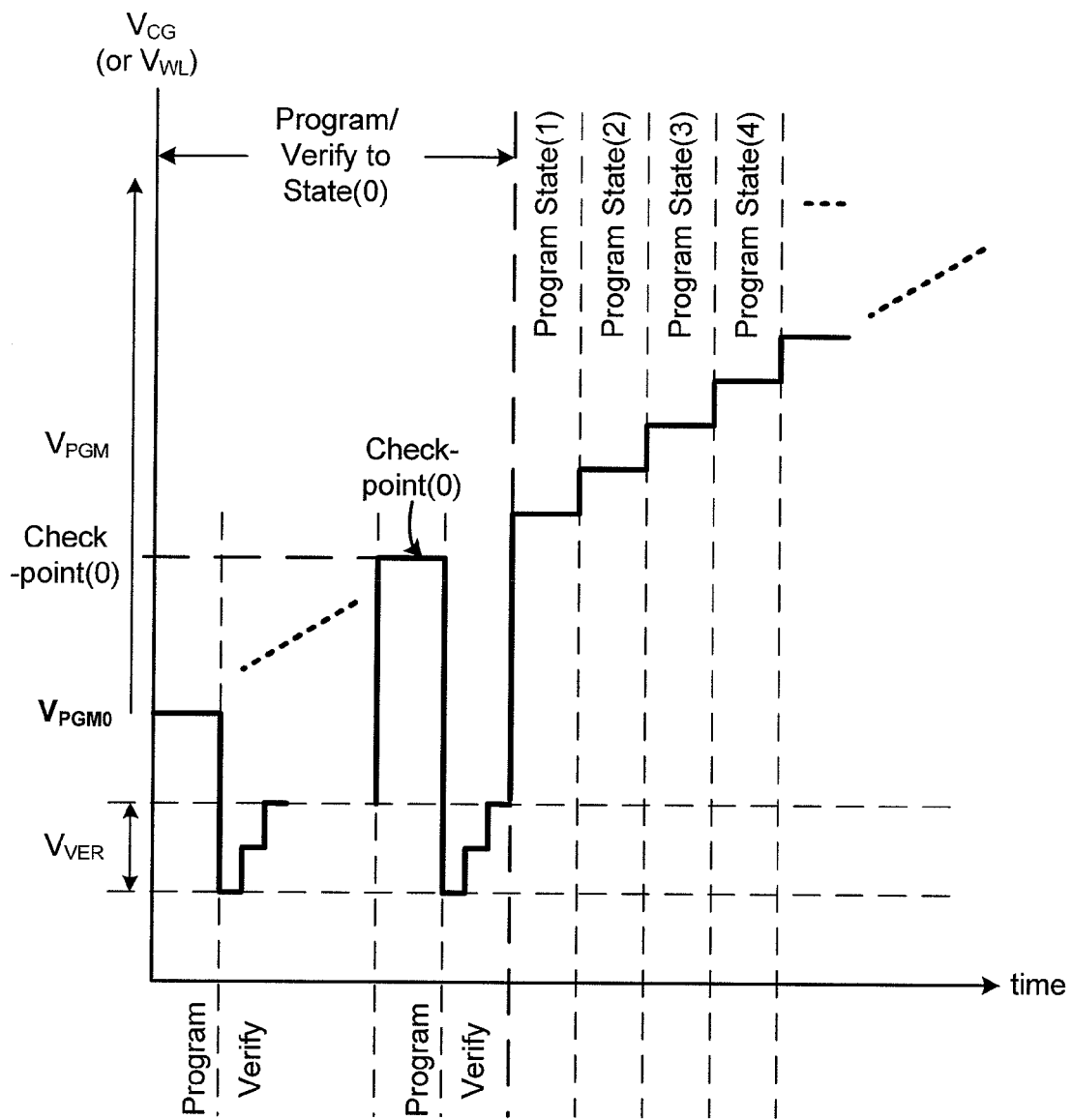
FIG. 11 illustrates the programming voltages in time with the calibration of the predetermined function shown in FIG. 9 followed by the application of it in predictive programming mode.

FIG. 11 illustrates the programming voltages in time with the calibration of the predetermined function shown in FIG. 9 followed by the application of it in predictive programming mode.

In an initial phase, a checkpoint(0) for the memory cell is designated to be at a threshold voltage level (checkpoint threshold voltage level) slightly higher than that considered to be associated with the erased state. A series of increasing programming voltage pulses is applied to program the memory cell toward the checkpoint threshold voltage level. The programming mode can be the conventional one of alternately programming and verifying until the checkpoint threshold voltage level is program-verified. Once the set of coordinates $[V_{PGM}, V_T]_{Checkpoint(0)}$ for Checkpoint(0) is known, the predetermined function (see FIG. 9) in the form of Equation (2) can be solved for $V_T(0)$ and be completely specified.

After the predetermined function in the form of Equation (2) is specified, the memory cell can subsequently be programmed in the predictive mode using the predetermined function to provide an estimated programming voltage level for a targeted threshold voltage level or for a targeted memory state. In a preferred embodiment, the programming voltage step size is adjusted such that each addition pulse will program the memory cell to the next memory state. For example of a memory cell with 16 possible memory states, the pulse size may be 300 mV. In this way, one additional pulse will program the memory to State(1), another additional pulse will program the memory to State(2), etc. Thus, programming to a given memory state can be reduced to counting the number of states from State(0) and supplying the same number of pulses. For example, a flag may be set once in State(0) and thereafter the memory cell can be programmed by a number of pulses same as the number of states the target state is away from State(0).

Other programming pulse sizes are possible. For example, for the memory cell with 16 possible memory states, the pulse size may be 150 mV. In that case, it will take two pulses to program from one memory state to the next adjacent memory state. This will provide finer resolution in the programming, which is useful in some implementations where a margin from the targeted threshold is employed.

Figure 12:
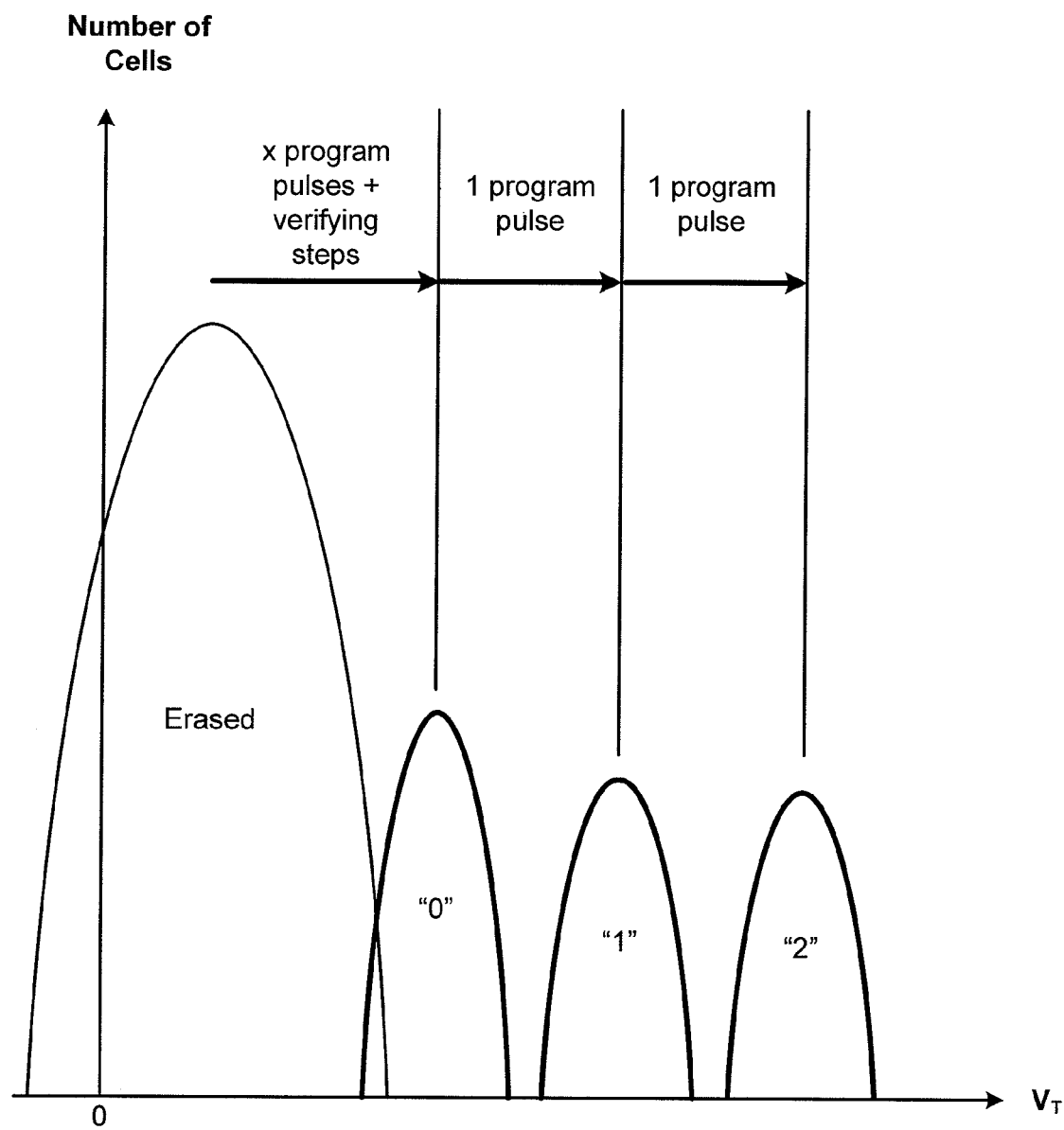
FIG. 12 illustrates schematically the distribution of various memory states of a page of memory cells during the programming process shown in FIG. 11.

FIG. 12 illustrates schematically the distribution of various memory states of a page of memory cells during the programming process shown in FIG. 11. The page of memory cells starts off with all the memory cells in an erased state which may in any one of low-lying threshold voltage levels. During the initial programming phase, a series of program/verify cycles (e.g., a total of x program pulses plus n*x verifying steps) will program the memory cell from the erase state to State(0). In general, the x for each memory cell is independent of each other. Once, the memory cell is in State(0), predictive programming mode commences and each additional pulse will program the memory cell to the next memory state.

Figure 13:
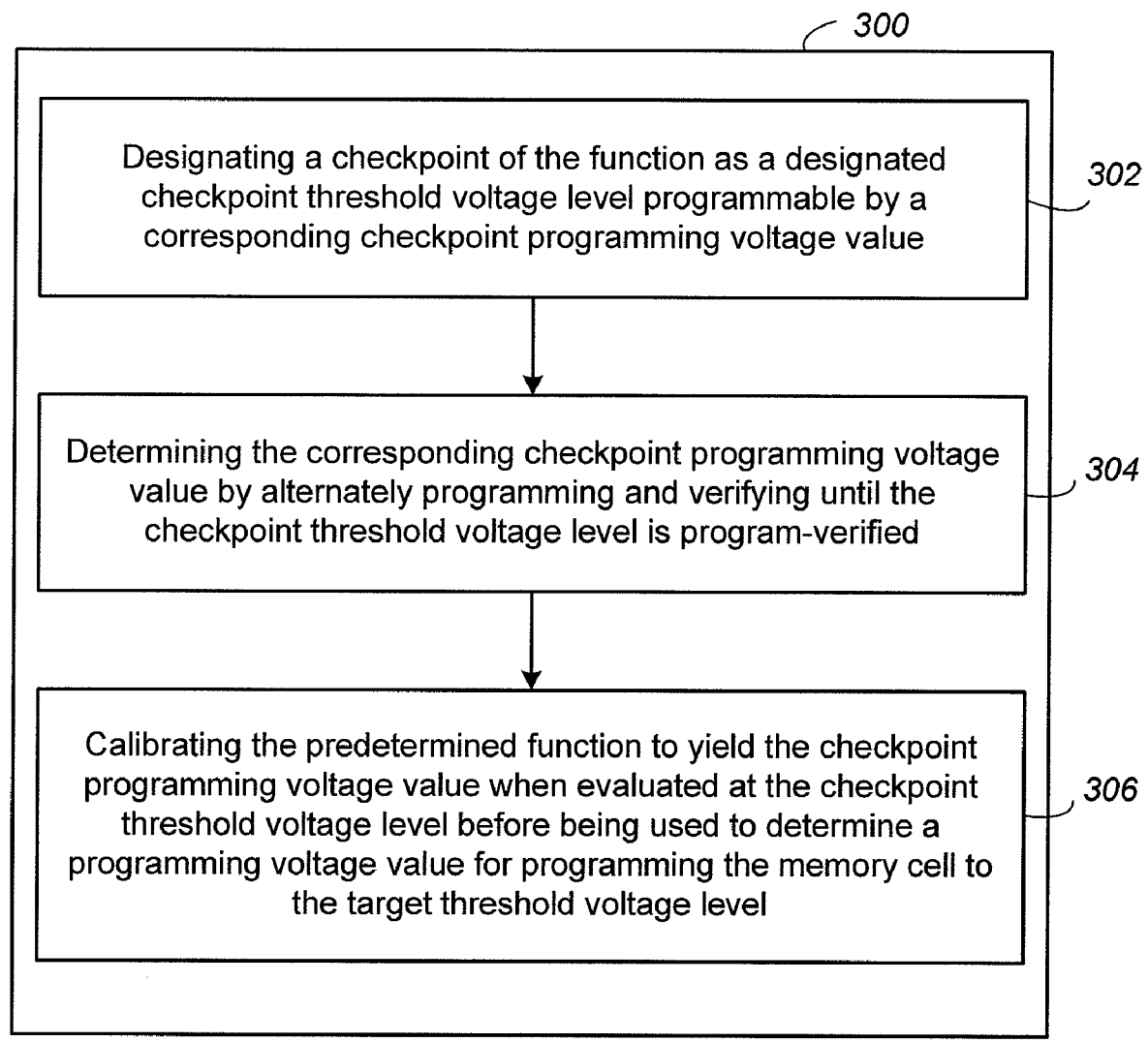
FIG. 13 is a flow diagram illustrating STEP 300 shown in FIG. 10 to include calibrating the predetermined function for a memory cell using a checkpoint.

FIG. 13 is a flow diagram illustrating STEP 300 shown in FIG. 10 to include calibrating the predetermined function for a memory cell using a checkpoint.

STEP 302: Designating a checkpoint of the function as a designated checkpoint threshold voltage level programmable by a corresponding checkpoint programming voltage value.

STEP 304: Determining the corresponding checkpoint programming voltage value by alternately programming and verifying until the checkpoint threshold voltage level is program-verified.

STEP 306: Calibrating the predetermined function to yield the checkpoint programming voltage value when evaluated at the checkpoint threshold voltage level before being used to determine a programming voltage value for programming the memory cell to the target threshold voltage level.

Figure 14:
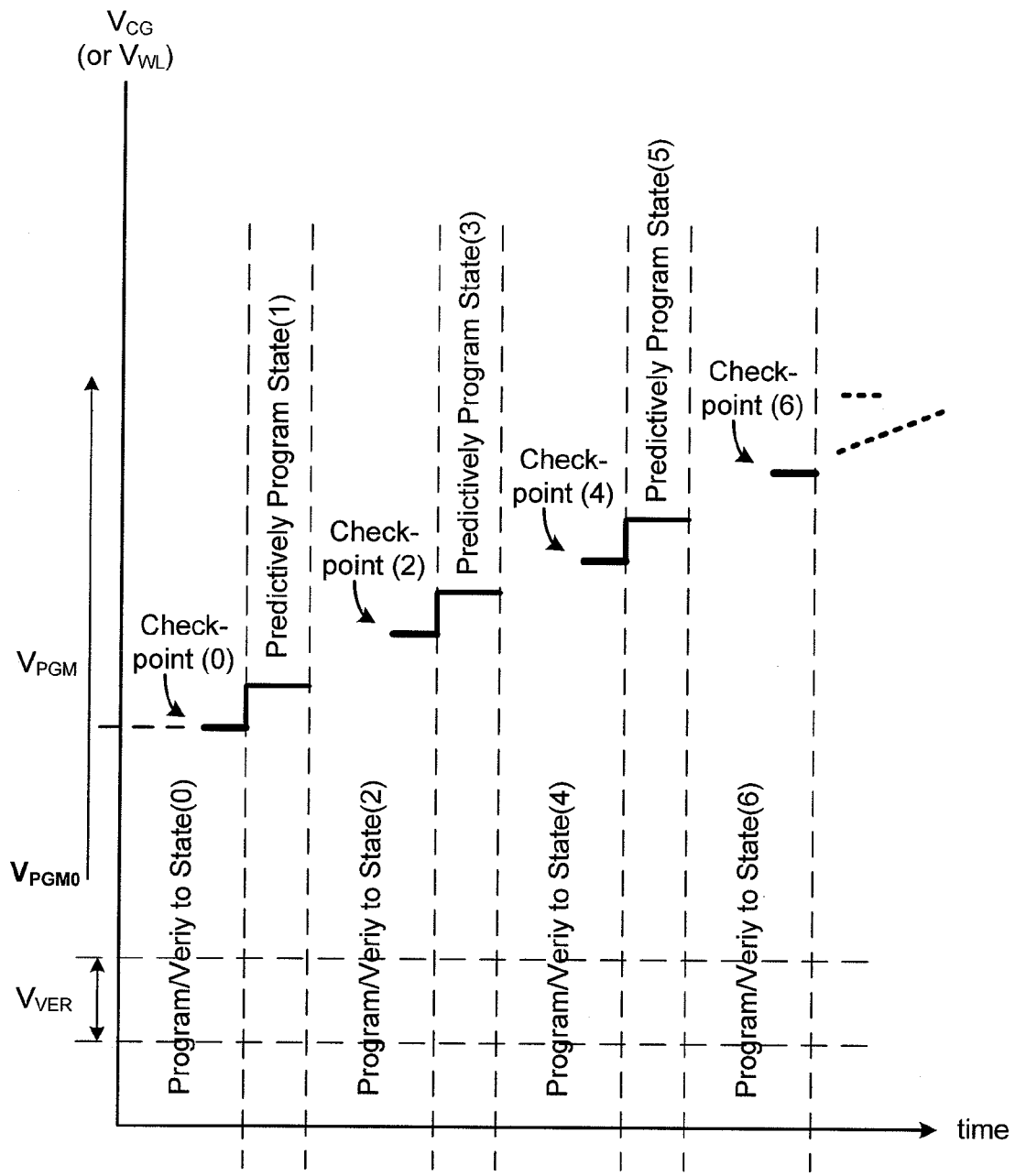
FIG. 14 illustrates a first example of an embodiment of predictive programming using more than one checkpoint.

FIG. 14 illustrates a first example of an embodiment of predictive programming using more than one checkpoint. In the first example, every memory state to be programmed by the predictive mode is preceded by a memory state programmed under the checkpoint mode. The checkpoint mode is described in FIG. 13 in STEP 302 and STEP 304. If the memory cell can be progressively programmed into State(0), State(1), State(2), . . . , then the even states State(0), State(2), State(4), . . . can be designated as checkpoints. These states are reached from a preceding state by the program/verify programming mode (see FIG. 6). From each checkpoint, a predetermined function can be calibrated and used to predictively program the next memory states, e.g., the odd State(1), State(3), State(5), . . . .

The embodiment illustrated in FIG. 14 allows programming in predictive mode to be at its most accurate since the predetermined function is recalibrated every other memory state and the cell programming behavior exhibits good linearity at such a short interval. As only every other memory state is programmed in the checkpoint mode, at least half of the verifying operations in convention programming (see FIG. 6) are avoided.

Figure 15:
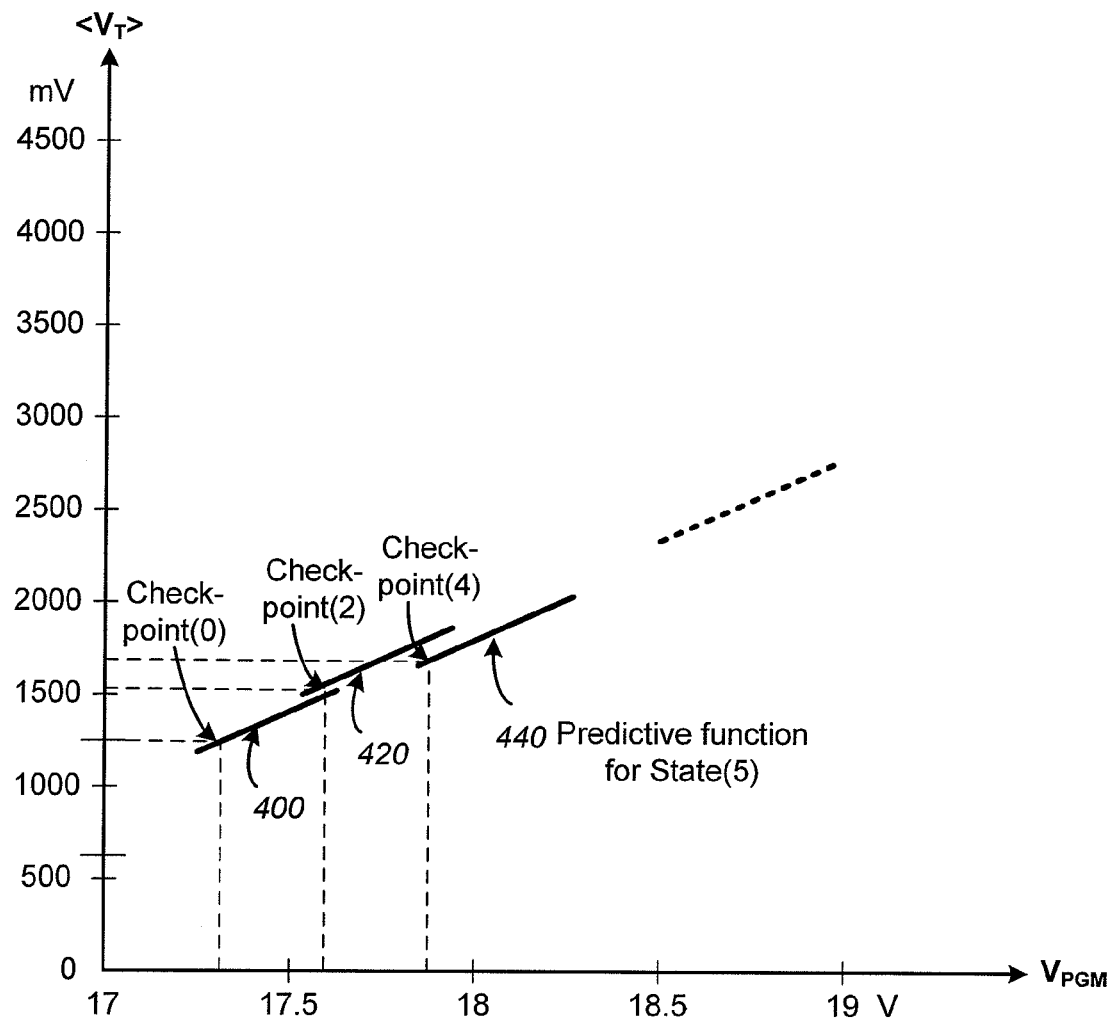
FIG. 15 illustrates the manner the checkpoints illustrated in FIG. 14 is used to calibrate various associated predetermined functions local to the checkpoints.

FIG. 15 illustrates the manner the checkpoints illustrated in FIG. 14 is used to calibrate various associated predetermined functions local to the checkpoints. It will be seen that all the local predetermined functions are linear and have the same predetermined mean slope. The checkpoint(0) is used to set the boundary condition for the local predetermined function

400. Similarly, the checkpoint(2) is used to set the boundary condition for the local predetermined function 420 and the checkpoint(4) is used to set the boundary condition for the local predetermined function 440, etc.

Once a local predetermined function is set, it can be used to yield the programming voltage level for the next memory state. Thus the local predetermined function 400 is used to yield a programming voltage level for programming the cell to State(1), the local predetermined function 420 is used to yield a programming voltage level for programming the cell to State(3) and the local predetermined function 440 is used to yield a programming voltage level for programming the cell to State(5), etc.

Figure 16:
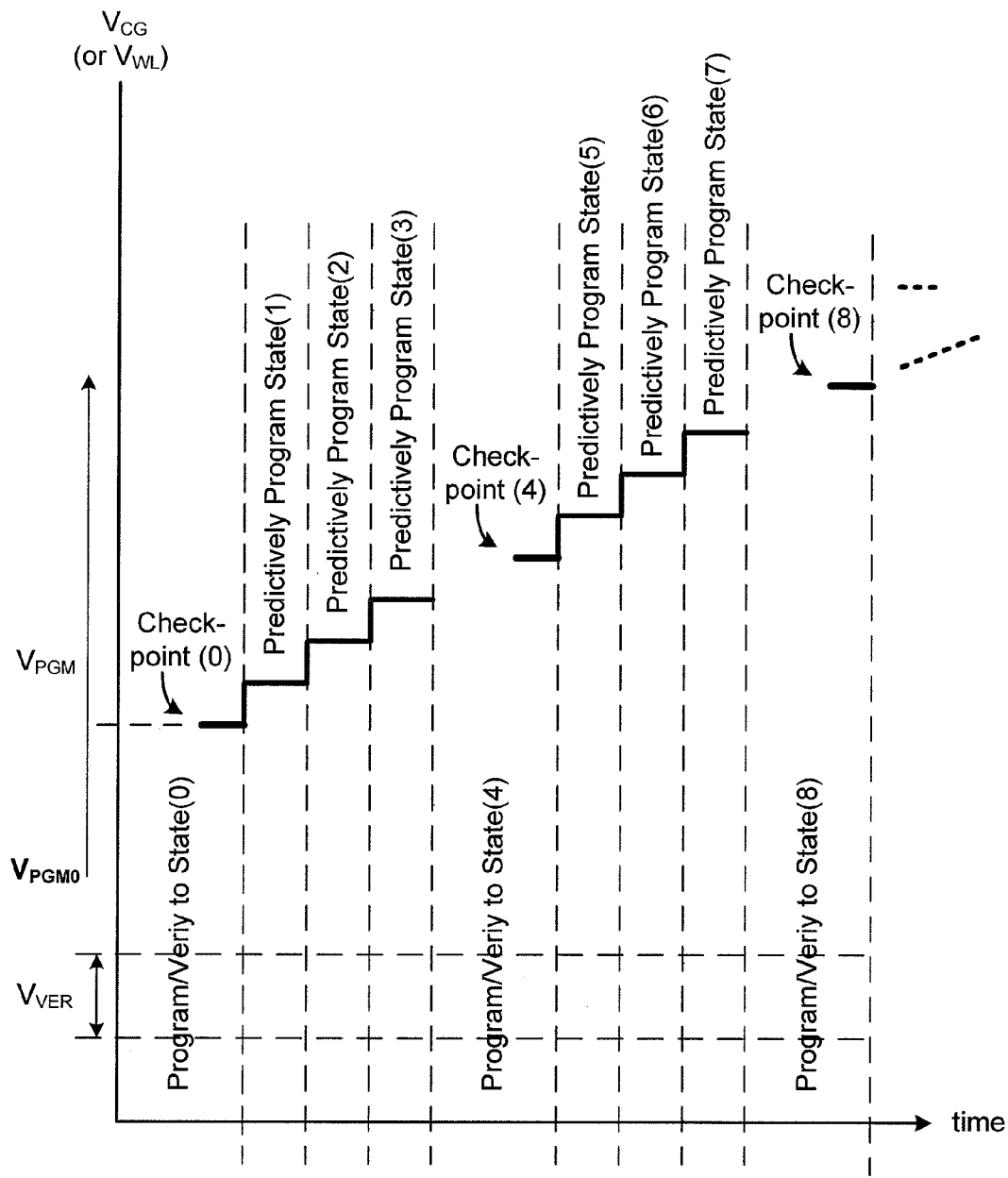
FIG. 16 illustrates a second example of an embodiment of predictive programming using more than one checkpoint.

FIG. 16 illustrates a second example of an embodiment of predictive programming using more than one checkpoint. In contrast to the first example shown in FIG. 14 and FIG. 15, the second example has a checkpoint designated in every four memory states. Thus a checkpoint(0) is designated at State (0), at State(4), at State(8), etc. The local predetermined function set by checkpoint(0) will be used to predict programming voltages respectively for the next three memory states, namely, State(1), State(2) and State(3). Similarly, the local predetermined function set by checkpoint(4) will be used to predict programming voltages respectively for the next three memory states, namely, State(5), State(6) and State(7), etc. The predicted programmed voltages resulted from this second example will not be as accurate as that of the first example, but may be sufficient in many applications. It has the advantage of further reducing the number of program-verify operations.

Other variations of designated checkpoints among the range of threshold values in the threshold window of a memory cell are possible. Choices can be made depending on the balance between performance and accuracy.

For example, in some programming algorithms, the page of memory cells are all programmed close to their respective target states in a first pass. Then a second programming pass will complete the programming to the respective target states. The two-pass approach is used to alleviate program disturb between floating gates of neighboring memory cells. Since the first pass programming does not demand as high precision as the second pass, the first pass can be performed using the predictive programming mode to save time. In some implementations, the second programming pass is also contemplated to employ the predictive programming mode, preferably with more checkpoints in place.

The predictive programming mode does not preclude a very slight possibility (estimated to be less than 0.1%) of overshooting a targeted threshold voltage level. In the case a targeted memory state is overshot, the error can be corrected by an implemented error correction code.

When two checkpoints are available, it is possible to independently set the slope of the predetermined function. Once the predetermined function is so specified, it can be used to yield programming voltage levels for subsequent memory states.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain embodiments, it is understood that the invention is entitled to protection within the full scope of the appended claims.

It is claimed:

1. A nonvolatile memory, comprising:
an array of memory cells, wherein the memory cells are individually programmable to one of a range of threshold voltage levels;
read/write circuits for reading and programming a page of memory cells in parallel;
a state machine for controlling the operation of said nonvolatile memory including said read/write circuits, said state machine:
providing a predetermined functions for a memory cell under programming, the function yielding programming voltage value as a function of threshold voltage level a memory cell is targeted to be programmed thereto;
controlling programming the memory cell to the target threshold voltage level with a programming voltage having increasing amplitude; and
stopping programming of the memory cell after the programming voltage has substantially reached a value as determined by the predetermined function evaluated at the target threshold voltage level.

2. The nonvolatile memory as in claim 1, wherein the programming voltage having increasing amplitude is a series of voltage pulses.

3. The nonvolatile memory as in claim 1, wherein the predetermined function is substantially a linear function.

4. The nonvolatile memory as in claim 1, wherein said state machine providing a predetermined function further includes:
designating a checkpoint of the function as a designated checkpoint threshold voltage level programmable by a corresponding checkpoint programming voltage value;
determining the corresponding checkpoint programming voltage value by alternately programming and verifying until the checkpoint threshold voltage level is program-verified; and
calibrating the predetermined function to yield the checkpoint programming voltage value when evaluated at the checkpoint threshold voltage level before being used to determine a programming voltage value for programming the memory cell to the target threshold voltage level.

5. The nonvolatile memory as in claim 4, wherein the target threshold voltage level is less than a predetermined voltage from the checkpoint threshold voltage level.

6. The nonvolatile memory as in claim 4, wherein one or more checkpoint threshold voltage level is designated among the range of threshold voltage levels.

7. The nonvolatile memory as in claim 4, wherein the predetermined function is linear and is defined by an estimated slope and a checkpoint.

8. The nonvolatile memory as in claims 4, wherein the predetermined function is substantially linear and is defined by at least two checkpoints.

9. The nonvolatile memory as in claim 1, wherein the nonvolatile memory has memory cells that individually store more than one bit of data.

10. The nonvolatile memory as in claim 1, wherein the nonvolatile memory has memory cells that individually store data as an amount of charge programmed into a charge storing element.

11. The nonvolatile memory as in claim 1, wherein the charge storing element is a floating gate of a field effect transistor.

12. The nonvolatile memory as in claim 1, wherein the charge storing element is a dielectric layer in a field effect transistor.

13. The nonvolatile memory as in claim 1, wherein the nonvolatile memory has memory cells with a NAND structure.

14. The nonvolatile memory as in claim 1, wherein the non-volatile memory is a flash EEPROM.

15. The nonvolatile memory as in claim 1, wherein the nonvolatile memory is embodied in a memory card.

16. The nonvolatile memory as in claim 1, wherein the nonvolatile memory is embedded in a computing device.

17. A nonvolatile memory, comprising:
- an array of memory cells, wherein the memory cells are individually programmable to one of a range of threshold voltage levels;
- means for providing a predetermined function for a memory cell under programming, the function yielding programming voltage value as a function of threshold voltage level a memory cell is targeted to be programmed thereto;
- means for controlling programming the memory cell to the target threshold voltage level with a programming voltage having increasing amplitude; and
- means for stopping programming of the memory cell after the programming voltage has substantially reached a value as determined by the predetermined function evaluated at the target threshold voltage level.

18. The nonvolatile memory as in claim 17, further comprising:
- means for designating a checkpoint of the function as a designated checkpoint threshold voltage level programmable by a corresponding checkpoint programming voltage value;
- means for determining the corresponding checkpoint programming voltage value by alternately programming and verifying until the checkpoint threshold voltage level is program-verified; and
- means for calibrating the predetermined function to yield the checkpoint programming voltage value when evaluated at the checkpoint threshold voltage level before being used to determine a programming voltage value for programming the memory cell to the target threshold voltage level.

19. A nonvolatile memory as in any one of claims 1-18, wherein the memory cell is one of a group of memory cells being programming together.

* * * * *